(12) United States Patent
Kurasaki

(10) Patent No.: US 8,580,585 B2
(45) Date of Patent: Nov. 12, 2013

(54) METHOD AND SYSTEM FOR CONTROLLED ISOTROPIC ETCHING ON A PLURALITY OF ETCH SYSTEMS

(75) Inventor: Howard Kurasaki, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 740 days.

(21) Appl. No.: 12/642,507

(22) Filed: Dec. 18, 2009

(65) Prior Publication Data

US 2011/0151594 A1 Jun. 23, 2011

(51) Int. Cl.
*H01L 21/67* (2006.01)
(52) U.S. Cl.
USPC ..... 438/8; 438/689; 156/345.23; 156/345.52; 257/E21.219
(58) Field of Classification Search
USPC ............... 438/689; 156/345.23, 345.52; 257/E21.219
See application file for complete search history.

(56) References Cited

U.S. PATENT DOCUMENTS

| | | | | |
|---|---|---|---|---|
| 5,203,958 A | * | 4/1993 | Arai et al. | 156/345.26 |
| 6,146,492 A | * | 11/2000 | Cho et al. | 156/345.24 |
| 7,416,676 B2 | * | 8/2008 | Fujihara et al. | 438/710 |
| 2006/0011582 A1 | * | 1/2006 | Savas | 156/345.29 |
| 2008/0236614 A1 | * | 10/2008 | Yakushiji et al. | 156/345.52 |
| 2009/0082895 A1 | * | 3/2009 | Barker et al. | 700/112 |

* cited by examiner

*Primary Examiner* — Mary Wilczewski
*Assistant Examiner* — Toniae Thomas
(74) *Attorney, Agent, or Firm* — Sawyer Law Group, P.C.

(57) ABSTRACT

A method for forming identical isotropic etch patterns in an etch system is disclosed. The method comprises providing a wafer paddle, a wafer, a plurality of identical etch systems, utilizing identical etch recipes within each of the plurality of etch systems, providing a fixed temperature stability time FTST for each system so that the heat transfer from the paddle to the wafer is constant, wherein the FTST is the same on each of the plurality of etch systems; and utilizing the plurality of identical etch systems to produce identical etches on each of the wafers based upon the FTST, wherein a five-second preheat step in the etch process is not utilized.

7 Claims, 5 Drawing Sheets

METHOD AND SYSTEM FOR CONTROLLED ISOTROPIC ETCHING ON A PLURALITY OF ETCH SYSTEMS

FIELD OF THE INVENTION

The present invention relates generally to semiconductor wafer fabrication and more particularly to controlled isotropic etching on multiple etch systems.

BACKGROUND

In semiconductor technology isotropic etching is non-directional removal of material from a substrate via a chemical process using an etchant substance. The etchant may be a corrosive liquid or a chemically active ionized gas, known as a plasma (Wikipedia—http://en.wikipedia.org/wiki/Isotropic_etching). By comparison anisotropic (or non-isotropic) etching is direction-sensitive, as material is removed from the substrate according to the crystal orientation of the silicon substrate.

Isotropic-anisotropic etch processes have been used to improve metal step coverage for both contact and via etch processes. Initially, the isotropic etch process was performed using a "wet" or buffered oxide etch (BOE) followed by a "dry" or plasma oxide etch for the anisotropic role. As geometries decreased, wet etches yielded to "dry" isotropic etches. The ability to control the amount of undercut for the isotropic etches is predicated on the gas chemistry, RF power, etch time, temperature, load size and material being etched. The "dry" isotropic etch immediately indicates that this is a "chemical" etch. The etch rate of a chemical etch is controlled by the temperature of the solution or in this case, the temperature of the wafer.

Isotropic etch repeatability has consistently been a problem with dry etches. Even when the closest manufacturing specifications are implemented, parameters such as chamber pressure (i.e. the speed at which the throttle valve operates) and gas flows, will differ from one etch system to the next. This is a leading cause in the variation of isotropic etch depths.

A common approach to reducing such process variability is to process single wafers in each chamber. However, chamber temperature increases result in greater "over etch" or greater isotropy between the first and last wafers in a lot.

Another approach to reducing isotropic etch process variability is to individually adjust the etch times for each etch recipe while using scanning electron microscope (SEM) photos to confirm both etch depth and critical dimension control. However, process variability due to pumping speed, mass flow controller stability, chamber pressure stabilization, RF tuning and other factors yield different etch results on different systems.

Accordingly, what is needed is a method of forming a semiconductor device that overcomes the above-described operational issues. The method should be cost-effective, easily implemented, efficient, and have good performance characteristics. The present invention addresses such a need.

SUMMARY OF THE INVENTION

The present invention satisfies this need, and presents a method and system for producing controlled isotropic etching on a plurality of etch systems. To achieve the above object, the present method is described as providing a paddle, a wafer, a plurality of identical etch systems, utilizing identical etch recipes within each of the plurality of etch systems, utilizing identical etch recipes within each of the plurality of etch systems, providing a fixed temperature stability time (FTST) for each system so that the heat transfer from the paddle to the wafer is constant, wherein the FTST is the same on each of the plurality of etch systems; and utilizing the plurality of identical etch systems to produce identical etches on each of the wafers based upon the FTST, wherein a five-second preheat step in the etch process is not utilized.

One advantage of a system and method in accordance with the present invention is the repeatability—the ability to consistently produce the same critical dimensions with nearly identical measurements without the need of altering other process conditions.

A second advantage of a system and method in accordance with the present invention is the reduced risk of over-etching since the temperature stabilization time is set to a predetermined time period that causes each wafer to receive identical amounts of heat at the same temperature.

A third advantage of a system and method in accordance with the present invention is the ability to match multiple etch systems to each other.

A fourth advantage of a system and method in accordance with the present invention is improved process reliability as a result of reduced wafer handling due to the elimination of a 5-second preheating step.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

DETAILED DESCRIPTION OF PREFERRED EMBODIMENTS

The present invention relates generally to semiconductor wafer fabrication and more particularly to controlled isotropic etching on multiple etch systems.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A method and system in accordance with the present invention uses a plurality of identical etch systems with identical etch recipes and a fixed temperature stability time (FTST) to provide a consistent identical etch on each wafer. In doing so, a high quality of semiconductor devices can be provided on a consistent basis. In prior art systems a preheat step is typically required. Through the use of a system and method in accordance with the present invention this step is eliminated. To describe the features of the present invention in more detail refer now to the following description in conjunction with the accompanying figures.

Figure 1:
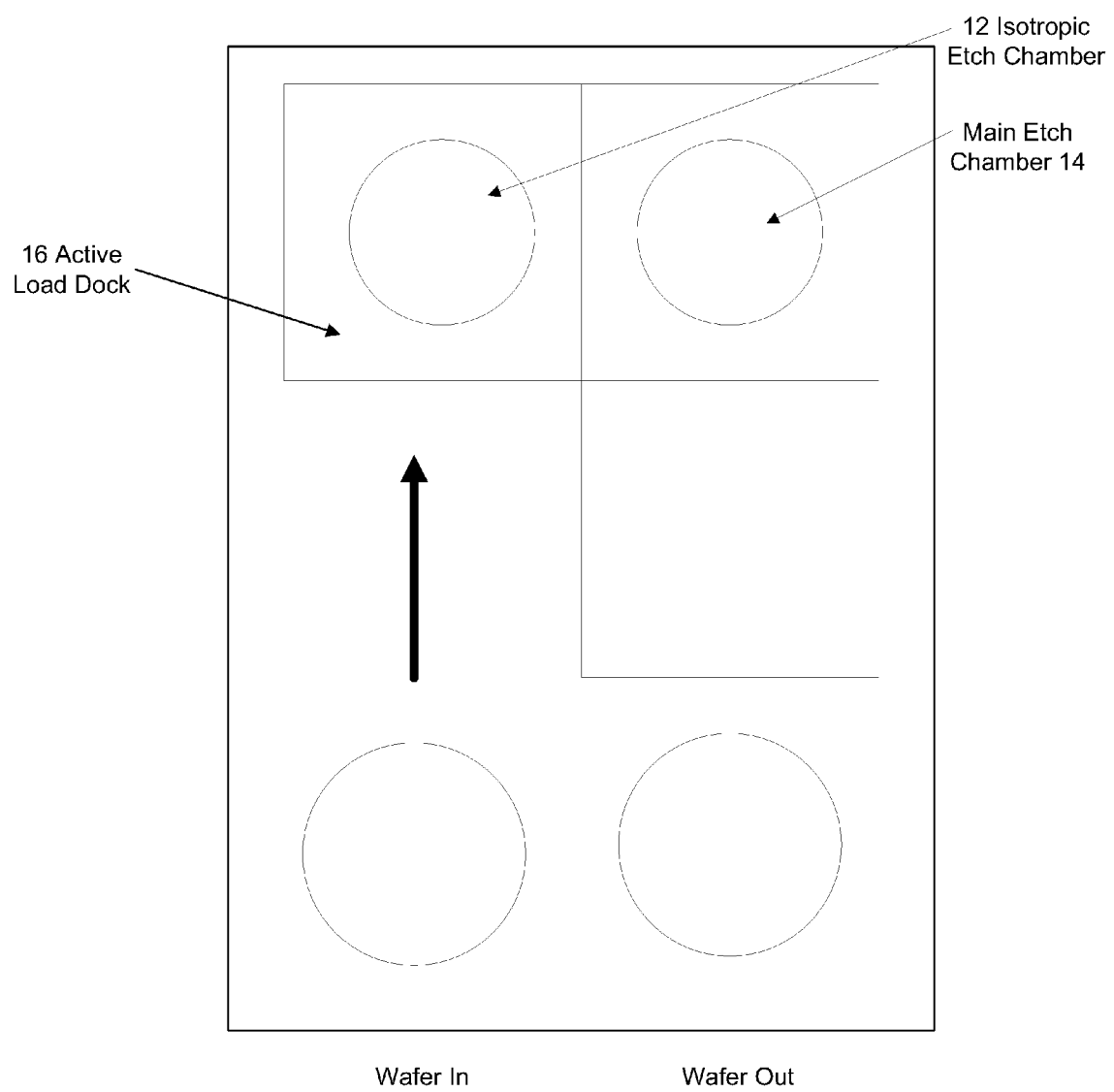
FIG. 1 is an illustration of an etch system in accordance with an embodiment.

FIG. 1 is an illustration of an etch system 10 in accordance with an embodiment. The etch system includes an isotropic etch chamber 12 and a main etch chamber 14. The system utilizes an active load dock 16. The wafer enters the isotropic etch chamber 12 via the active load dock 16. The isotropic portion of the etch process is then performed in isotropic etch chamber 12. Next, the wafer progresses to the main chamber 14 where an isotropic etch process is performed before the wafer exits the etch system 10.

Figure 2:
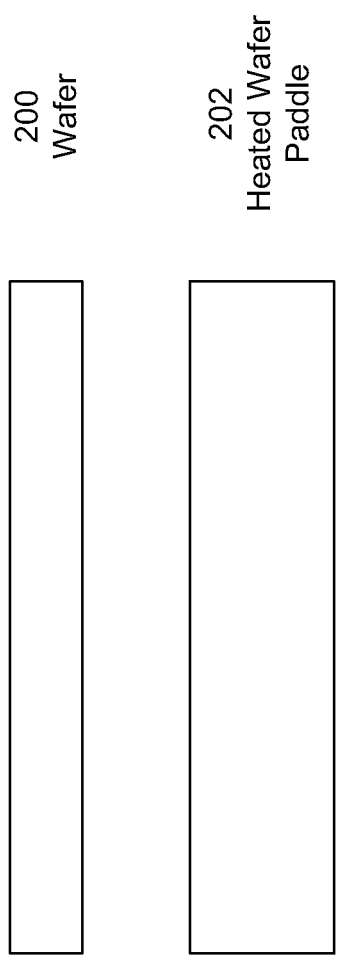
FIG. 2 illustrates the isotropic portion of the etch chamber prior to the dry isotropic etch process.

FIG. 2 illustrates the isotropic portion of the etch chamber prior to the dry isotropic etch process. To begin, the wafer 200 is uniformly heated throughout, via the heated wafer paddle 202 for a specific time period known as a fixed temperature stability time (FTST). The FTST is independent of the chamber pressure and gas flows. The chamber pressure is controlled by an automated throttle valve while the gas flows are controlled by mass flow controllers. This temperature-controlled process step assures that heat transfer from the heated wafer paddle to the wafer is constant for the wafer, and consistent for each wafer having the same FTST. In addition, the FTST reduces the variability of the undercut while at the same time allows for improved process control. The FTST will vary according to the wafer material type (silicon, Galium Arsenide, etc.) Within one particular etch system, a plurality of FTSTs may be utilized with each wafer processed utilizing a different FTST. Finally, it is noted that a preheat step is not required anywhere within this etch process.

Figure 3:
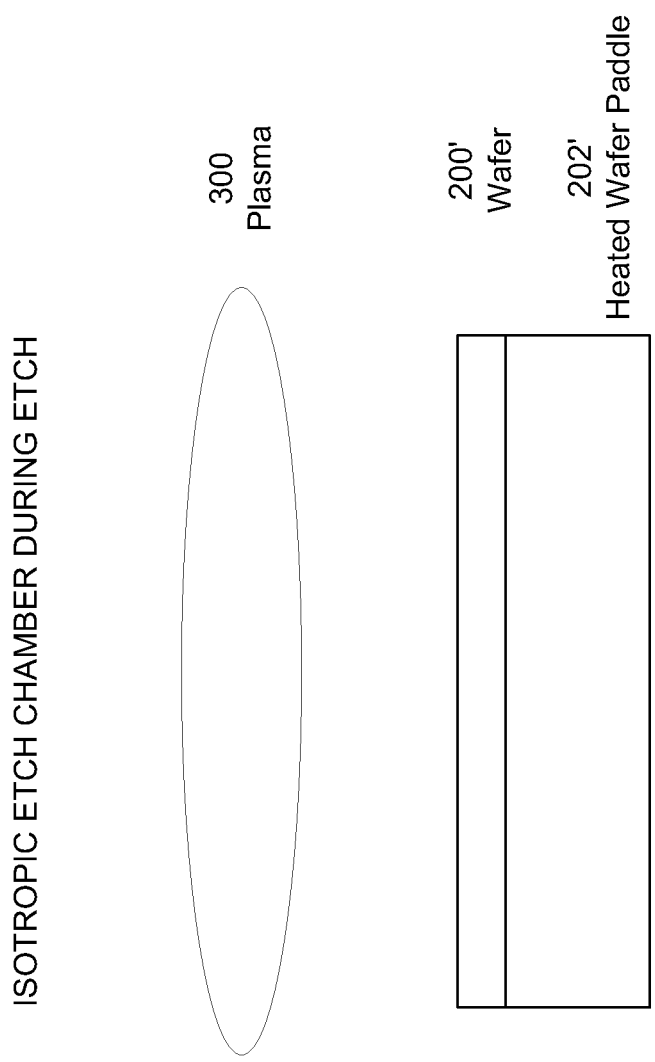
FIG. 3 illustrates the dry isotropic etch process within an isotropic chamber.

FIG. 3 illustrates the dry isotropic etch process within an isotropic chamber. A plasma source 300 is applied to the uniformly heated wafer 200' as it sits upon the heated wafer paddle 202' inside the isotropic chamber. During the process, the plasma will generate volatile etch products at room temperature from the chemical reactions between the elements of the material etched and the reactive species generated by the plasma. Following the etch, the wafers are removed from the chamber and processed in hydrofluoric acid (not shown). The photoresist is then removed and both inner and outer diameters measurements are taken in order to determine the amount of isotropic undercut.

Figure 4:
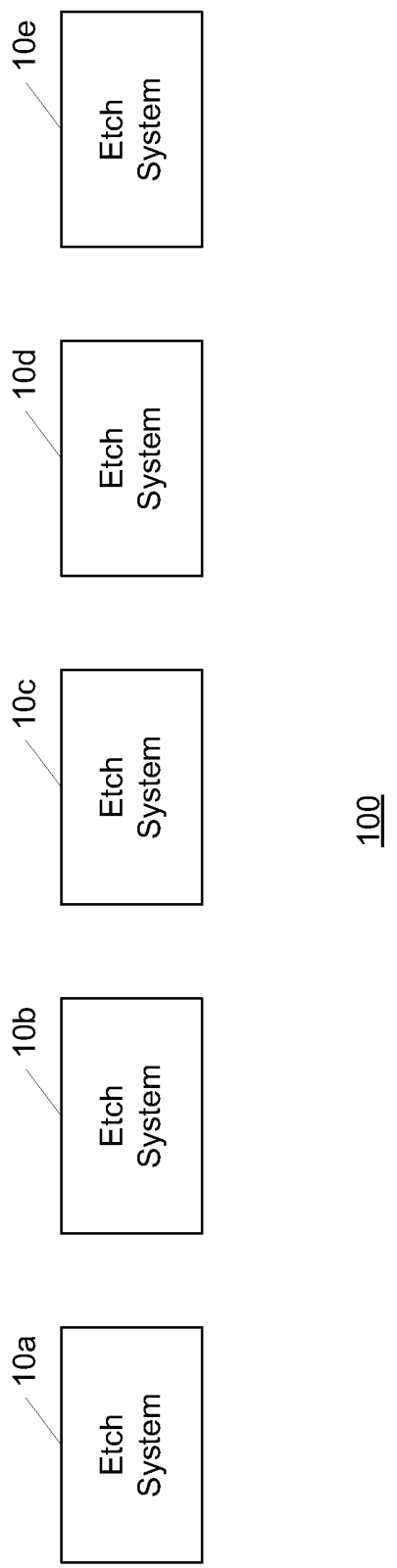
FIG. 4 is an illustration of a plurality of identical etch systems.

FIG. 4 is an illustration of a plurality of identical etch systems 10a-10e that are utilized to provide a process in accordance with the present invention. Thereafter the main etch chamber 14 provides for providing controlled isotropic etching utilizing the etch systems of FIGS. 1-3.

Figure 5:
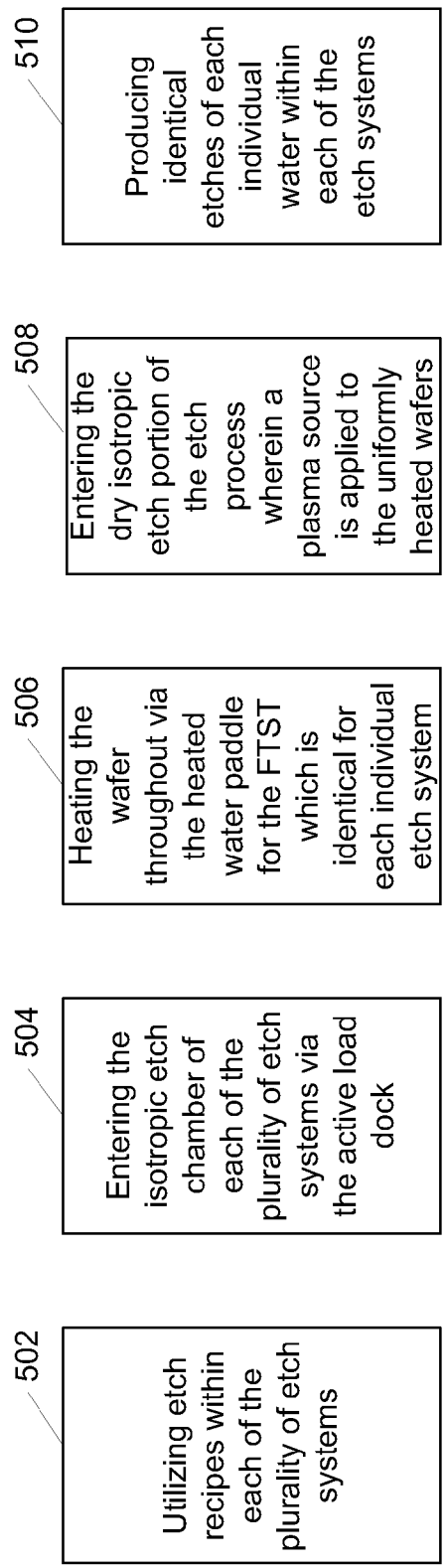
FIG. 5 is a flow chart for providing controlled isotropic etching utilizing the etch systems of FIGS. 2 and 3.

FIG. 5 is a flow chart for providing controlled isotropic etching utilizing the etch systems of FIGS. 2 and 3. Referring now to FIGS. 1-4, first identical etch recipes are utilized within each of the plurality of etch systems 10a-10e, via step 502. Next, each wafer enters the isotropic etch chamber 12 of each of the plurality of etch systems 10a-10e via the active load dock 16 via step 504. Once inside the isotropic etch chamber, the wafer 200 is heated throughout via the heated wafer paddle 202 for the fixed temperature stability time (FTST) which is identical for each individual etch system via step 506. Because the FTST is identical throughout the plurality of etch systems, it is assured that the heat transfer from the heated wafer paddles to each wafer has been consistent as well as constant, i.e., each wafer has been identically and uniformly heated at this point. Next, each identically heated wafer in the plurality of etch systems enters into the dry isotropic etch portion of the etch process wherein a plasma source 300 is applied to the uniformly heated wafers via step 508.

Finally, as the plasma 300 is applied to the uniformly heated wafer of each of the plurality of etch systems, identical etches are produced on each individual wafer within each of the etch systems via step 510.

A method and system in accordance with the present invention could be illustrated with the following example described below.

To begin, a user can select a desired FTST time which will remain constant while the isotropic etch times are varied. Isotropic etch times are varied in order to target a particular isotropic undercut percentage because each wafer will have a different isotropic undercut percentage which varies with time. The variety in isotropic etch times will produce a range of isotropic undercut percentage in the etch results, and within that range, a user can then correlate each etch time with its corresponding isotropic undercut percentage, based on the etch results. Once the isotropic etch time and corresponding isotropic undercut percentage are known, a user may then select a desired isotropic etch time and apply it together with a set FTST to a plurality of etch systems, and receive identical etch results across the plurality of etch systems.

In this particular example, a FTST of 30 seconds was used, and the isotropic etch times consisted of: 12, 16, 20, 24, and 28 seconds in order to target a 33 to 50% isotropic undercut. At the completion of the etch process, the wafers were then processed in 100:1 Hydrofluoric Acid (HF) for 60 seconds. The photoresist was then removed, the wafers were inspected and the isotropic etch depths were measured at critical dimension measurement sites. Cross-sectional Scanning Electron Microscope (SEMs) were utilized to measure the isotropic undercut as a percentage of the full dielectric thickness. As shown in Table 1, each of the five isotropic etch times correlates to an isotropy undercut percentage.

TABLE 1

| WAFER | ETCH TIME (seconds) | ISOTROPIC DEPTH | DIELECTRIC | ISOTROPY % |
|---|---|---|---|---|
| 14 | 12 | 1901 Å | 7050 Å | 27.0 |
| 15 | 16 | 1901 Å | 6940 Å | 36.0 |
| 16 | 20 | 1901 Å | 7150 Å | 40.6 |
| 17 | 24 | 1901 Å | 6945 Å | 45.3 |
| 18 | 28 | 1901 Å | 6895 Å | 55.8 |

Next, based on the range of isotropy undercut percentages, a corresponding etch time may be selected according to the user's needs. Once a desired etch time is identified, that particular etch time may be utilized on a plurality of etch systems, and the resulting critical dimensions of all wafers will be identical from the plurality of etch systems, as shown below in Table 2.

TABLE 2

| ETCH SYSTEM | WAFER | ETCH TIME | INNER DIAMETER | OUTER DIAMETER |
|---|---|---|---|---|
| 1 | 03 | 23 s | 0.687 µm | 1.171 µm |
| 2 | 05 | 23 s | 0.688 µm | 1.176 µm |
| 3 | 04 | 23 s | 0.684 µm | 1.167 µm |
| 4 | 02 | 23 s | 0.689 µm | 1.191 µm |
| 5 | 06 | 23 s | 0.689 µm | 1.191 µm |

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of forming identical isotropic etch patterns in a plurality of systems, wherein each etch system is identical and includes a plurality of wafer paddles and a plurality of wafers, the method comprising:
   utilizing identical etch recipes within each of the plurality of etch systems;
   providing a fixed temperature stability time (FTST) for each etch system so that the heat transfer from the wafer paddle to the wafer is constant, wherein the FTST is the same on each of the plurality of etch systems; and
   utilizing the plurality of identical etch systems to produce identical etches on each of the wafers based upon the FTST.

2. The method of claim 1, including determining the etch time of each of the wafers based upon the FTST.

3. The method of claim 2 wherein the determining step further comprises:
   providing a plurality of wafers in each of the etch systems;
   providing a different etch time for each wafer;
   obtaining an isotropy undercut percentage of each etched wafer by measuring the critical dimensions of each wafer with a scanning electron microscope,
   correlating the isotropy undercut percentage of each wafer with its particular different etch time,
   selecting a desired etch time based on the correlated isotropy undercut percentage,
   utilizing the desired etch time on each of the plurality of etch systems.

4. The method of claim 1 wherein the FTST varies according to the wafer material.

5. The method of claim 1 wherein the FTST is 30 seconds for silicon.

6. The method of claim 1 wherein the etch time is 12-28 seconds.

7. The method of claim 2 wherein the correlated isotropy undercut percentage is 33-50%.

* * * * *